United States Patent [19]

Simmonds et al.

[11] 4,321,529

[45] Mar. 23, 1982

[54] POWER FACTOR METERING DEVICE

[76] Inventors: Charles W. Simmonds, 2214 Bryan Cir., Salt Lake City, Utah 84108; Dennis B. Ardin, 2122 Sahara Dr., Salt Lake City, Utah 84117

[21] Appl. No.: 81,244

[22] Filed: Oct. 2, 1979

[51] Int. Cl.³ .......................................... G01R 25/00
[52] U.S. Cl. ................................ 324/83 R; 324/83 A; 324/127
[58] Field of Search ................ 324/83 R, 83 A, 83 D, 324/86, 127

[56] References Cited

U.S. PATENT DOCUMENTS 3,052,844  9/1962  Varterasian ..................... 324/83 A
3,986,116  10/1976  Smith ................................ 324/127

Primary Examiner—Michael J. Tokar
Attorney, Agent, or Firm—H. Ross Workman; Rick D. Nydegger

[57] ABSTRACT

A power factor metering device. The power factor metering device includes a novel electronic circuit for deriving the power factor from a detected voltage and current. The device includes a current clamp that may be clamped onto any conductor of a three-phase or single-phase circuit. Voltage clips are used to detect the circuit's voltage. The current clamp induces a voltage that lags the detected current by 90 electrical degrees. An amplifier stage is coupled to the induced voltage through a low input variable resistance so that the input voltage to the amplifier stage may be adjusted to correct for errors induced in the phase relationship between the detected voltage and current. The output from the amplifier stage is input into a zero crossing detector stage that changes its output state each time the output of the amplifier stage passes through zero. The output of the zero crossing detector stage is applied to one side of a pair of EXCLUSIVE-OR gates, and is also applied to one of the inputs of a bistable multivibrator. The voltage detected by the voltage clips is stepped down by a transformer and is input to a second zero crossing detector stage. The output from the second zero crossing detector stage provides the other input to the EXCLUSIVE-OR gates and the bistable multivibrator. The output of each EXCLUSIVE-OR gate is directly proportional to the phase angle between the detected voltage and current. The outputs from the two EXCLUSIVE-OR gates are amplified and are used to drive a continuous recording device and an instantaneous meter which each display the magnitude of the power factor derived from the detected current and voltage. The output from the bistable multivibrator is used to determine whether the current signal leads or lags the voltage signal.

24 Claims, 6 Drawing Figures

POWER FACTOR METERING DEVICE

BACKGROUND

1. Field of the Invention

The present invention relates in general to electrical devices for measuring and indicating the phase angle between two signals and, more particularly, to devices for measuring and indicating the power factor derived from a detected current and voltage.

2. The Prior Art

The total electrical energy that is necessary to operate the appliances in a home or the machinery in a factory typically consists of two components. One of the components is termed "average power." The average power is the electrical energy actually expended by an electrical system in driving the appliances or machinery in use. The other component is called "reactive power" or "reactive volt-amperes," commonly abbreviated as "vars." Reactive power is electrical energy that is stored in the capacitive or inductive elements of a circuit. Reactive power represents an inefficiency in terms of the total electrical energy available for productive use by an electrical system.

The relationship between the average power and reactive power may be given by the complex equation $$P = VI \cos \theta - jVI \sin \theta$$

where P represents the total complex power and where V represents the AC voltage, I represents the AC current, and $\theta$ represents the phase angle between the voltage and current.

In the above equation $VI \cos \theta$ represents the average power, whereas $VI \sin \theta$ represents the reactive power. The quantity $\cos \theta$ is referred to as the power factor.

The efficiency of an electrical system may readily be determined by examining the angle between the voltage and current. When the power factor (i.e. $\cos \theta$) is 1 (i.e. when $\theta = 0$ degrees and the current and voltage are in phase) an electrical system will be at peak efficiency. As $\theta$ approaches 90 degrees the system's inefficiency due to vars will progressively increase. Maximum inefficiency loss due to vars occurs where $\cos \theta = 0$ (i.e. where the current and voltage are 90 degrees out of phase). In an inductive circuit, the angle $\theta$ will be negative and the current will lag the voltage. In a capacitive circuit the phase angle will be positive and the current will lead the voltage.

By knowing the magnitude of the angle $\theta$ and whether $\theta$ is leading or lagging, the efficiency of an electrical system may be corrected by adding capacitance to an inductive circuit or by adding inductance to a capacitive circuit. In this way the efficiency of an electrical system may be significantly increased.

With the growing emphasis on energy conservation, utility companies are becoming increasingly aware of the power factor of the electrical systems of their customers. It is not uncommon for utility companies to charge higher rates to customers, particularly industrial or commercial customers, that have electrical systems having a low power factor. Accordingly there is an increasing need to be able to easily and quickly measure the power factor of an electrical system in order to determine and improve its efficiency.

Various types of prior art devices have been developed which have been used for purposes of measuring the power factor of an electrical system. One such prior art device is electromechanical in its nature. This type of device uses one fixed coil and one movable coil and determines the phase angle and hence the power factor from the amount of torque exerted on the movable coil. Although reliable, this type of device is bulky and relatively expensive to manufacture.

With the advent of computer technology, more sophisticated kinds of power factor metering devices have been devised. See, for example, U.S. Pat. Nos. 2,970,263 and 3,084,863.

Various types of phase metering devices have also been developed for purposes of measuring the phase difference between communication signals such as commonly used in radio or television. See, for example, U.S. Pat. Nos. 3,358,231, 3,631,340, 3,725,781, 3,787,765, 3,805,153, 3,984,701 and 4,025,848.

Although each of the above-indicated types of prior art phase metering devices may work well for their intended applications, to date there has not been developed an efficient and portable power factor metering device that is compact, economical and that conveniently provides all the necessary power factor information derived from an electrical system.

Thus, what is needed is a compact, portable power factor metering device that is economical and reliable in its operation. The power factor metering device should be operable at various levels of input voltage and should provide an instantaneous power factor readout so that the power factor of a system can be spot checked at any time. The power factor metering device should also provide a continuous recording device so that the nature of electrical loads can be analyzed under various conditions and over a period of time. The device should also be capable of indicating whether a particular system is leading or lagging so that the proper correctional measures can be taken to improve the power factor. Such an invention is disclosed and claimed herein.

BRIEF DESCRIPTION AND OBJECTS OF THE INVENTION

The power factor metering device of the present invention consists of an electronic circuit constructed largely from solid state components so as to reduce the size of the device, making it easily portable and reliable in its operation. The power factor metering device of the present invention has a plurality of selectable plug configurations which permit the device to be used with any one of a variety of input voltage levels. A continuous recording device can be connected to record the power factor over an extended period of time so that the nature of an electrical load may be analyzed at various times and during various load conditions. An instantaneous readout meter is also provided so that the power factor of an electrical system can be spot checked at any given time. Lamp indicators are used to show whether the power factor is leading or lagging. The novel solid state circuit derives the power factor from a detected current and voltage and is designed to compensate for errors induced when detecting the current and voltage.

It is therefore a primary object of the present invention to provide an improved power factor metering device.

Another object of the present invention is to provide a power factor metering device that is capable of indicating whether the power factor is leading or lagging and that is capable of providing an instantaneous readout of the power factor as well as a continuous recorder output (0–1 mA) of the power factor over an extended period of time.

Yet a further object of the present invention is to provide a power factor metering device that may be used with any one of a variety of different input voltage levels.

A further object of the present invention is to provide a power factor metering device having solid state logic circuitry designed to reduce costs and increase reliability and portability of the power factor metering device.

Still a further object of the present invention is to provide a novel electronic circuit for a power factor metering device wherein errors that may be induced in the phase angle when detecting the current and voltage are compensated for by the circuit.

These and other objects and features of the present invention will become more readily apparent from the following description taken in conjunction with the accompanying drawings.

DETAILED DESCRIPTION OF THE PREFERRED EMBODIMENT

Figure 1:
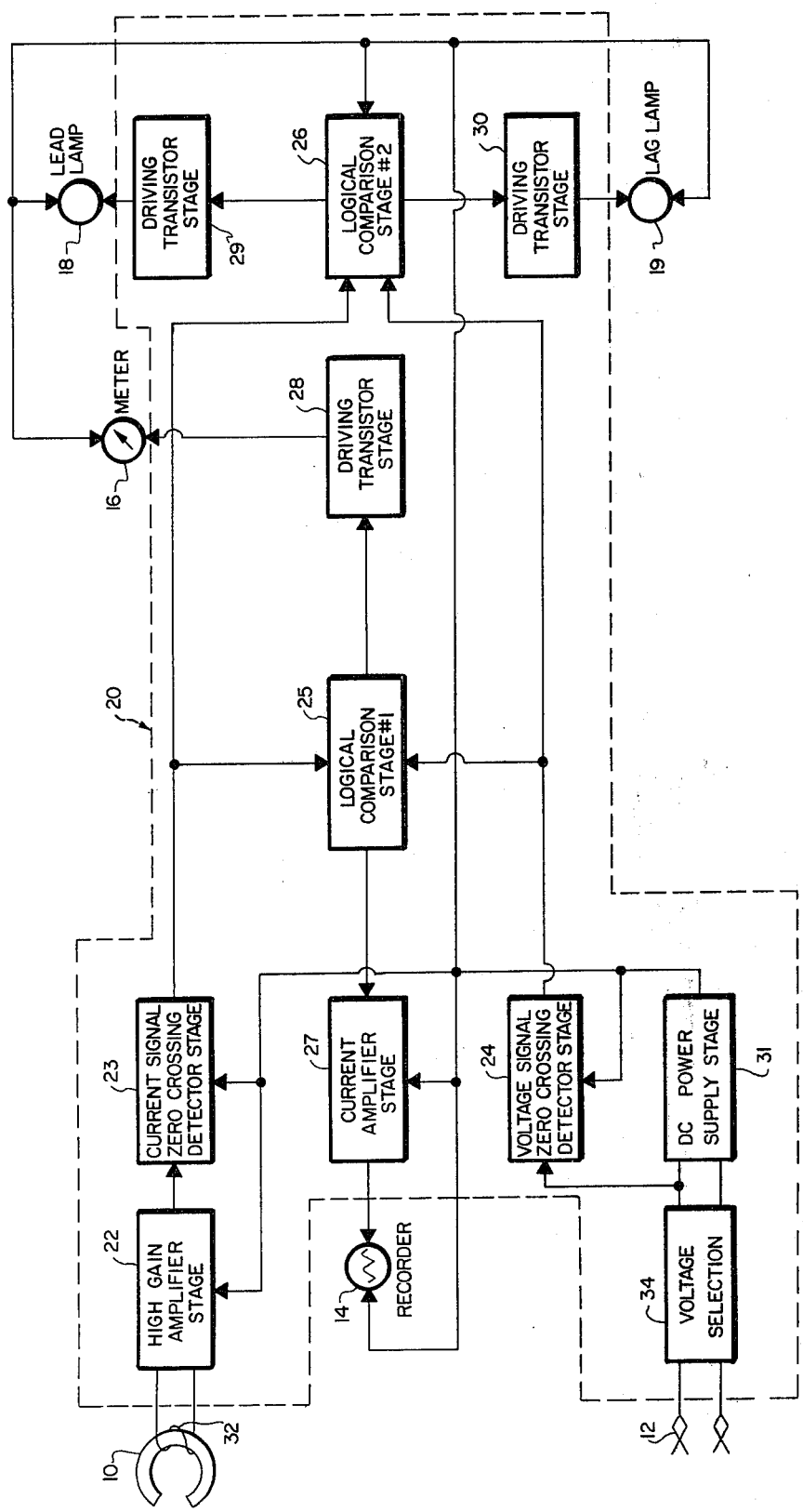
FIG. 1 is a block diagram that illustrates the relationship between the various components of the power factor metering device of the present invention.

Reference is now made to the figures wherein like parts are designated with like numerals throughout. The block diagram of FIG. 1 generally illustrates the way in which the various components of the power factor metering device of the present invention are interconnected As shown in FIG. 1, the power factor metering device consists basically of six components: a current clamp 10; a pair of voltage clips 12; a recorder 14; a meter 16; a pair of lamp indicators 18 and 19; and an electronic circuit generally designated by the broken line box indicated at 20.

With further reference to FIG. 1, current clamp 10 is placed on a line (not shown) of a single phase or three phase circuit. The AC current flowing through the line (not shown) induces a magnetic flux in clamp 10. The magnetic flux in turn induces a voltage across an inductive coil 32. The induced voltage across coil 32 is proportional to the AC current detected by clamp 10. As described in more detail below, the induced voltage across coil 32 is thereafter amplified and used to provide one of the input signals from which the power factor and lead-lag relationship between the current and voltage of the single or three phase circuit are derived.

Voltage clips 12 are used to detect the voltage of the line (not shown) of the single or three phase circuit being monitored. As further shown in FIG. 1, voltage clips 12 are coupled to a voltage selection device 34. Voltage selection device 34 may be used with a variety of different input voltages, as for example 120 volt, 240 volt, 480 volt wye and 480 volt delta inputs. Voltage selection device 34 provides a reduced voltage at its output that is subsequently used to provide the other input signal from which the power factor and lead-lag relationship are derived by electronic circuit 20.

With continued reference to FIG. 1, the induced voltage across coil 32 is used as the input to a high gain amplifier stage 22 of circuit 20. Since the voltage induced by coil 32 will be approximately 90° out of phase with the detected current, amplifier stage 22 is designed to further shift the phase of the induced voltage an additional 90° in order to compensate for the induced 90° phase shift caused by coil 32. Additionally, amplifier stage 22 is designed to compensate for errors induced in the phase relationship between the induced voltage of coil 32 and the voltage output by the voltage selection device 34.

For example, a slight shift in the phase of the voltage output by voltage selection device 34 may be compensated by a corresponding shift in the phase of the induced voltage input to the amplifier stage 22. Advantageously, this eliminates any error in the power factor subsequently derived from the phase relationship between the voltage signals of coil 32 and voltage selection device 34.

The amplified signal from the high gain amplifier stage 22 is next input into a zero crossing detector stage 23. The signal from the voltage selection device 34 is likewise input into a similarly configured zero crossing detector stage 24. Each of the zero crossing detector stages 23 and 24 is designed to clamp the input voltage signals to the logical voltage levels of 0 and +5 volts DC. Thereafter, the zero crossing detector stages 23 and 24 change their output levels from 0 to +5 volts DC and from +5 volts DC back to 0 each time their respective input signal crosses through zero. In this manner the input voltage signals from the amplifier stage 22 and voltage selection device 34 are transformed into square wave signals that are limited to 0 and +5 volts DC. The square wave signal output from zero crossing detector stage 23 corresponds to the detected AC current, while the square wave signal output from zero crossing detector stage 24 corresponds to the detected AC voltage of the single or three phase current being monitored.

The two square wave signals output from zero crossing detector stages 23 and 24 are then input into a first logical comparison stage 25. Logical comparison stage 25 provides at its output a square wave signal that consists of a series of doubled pulses. As more fully described below, the width of each doubled pulse is directly proportional to the phase angle between the detected current and voltage. The doubled pulses from logical comparison stage 25 are then amplified by current amplifier stage 27 and transistor stage 28, which in turn can drive a continuous recording device 14 and an instantaneous metering device 16. Recorder 14 permits the magnitude of the power factor of the monitored circuit to be recorded over a period of time, while meter 16 provides an instantaneous readout at any given point in time. Although it is often advantageous to have both types of power factor readout devices available, clearly either type device (i.e. the recorder 14 or meter 16) could be used without the other. Additionally, an output jack for either type device could be provided so that the particular type of readout device desired by a particular user could be purchased independently of the other components of the present invention.

The two square wave signals output from zero crossing detector stages 23 and 24 are also input into a second logical comparison stage 26. Logical comparison stage 26 compares the two input signals and determines which signal occurs first in time. If the square wave signal from the current signal zero crossing detector 23 occurs first, then logical comparison stage 26 will provide an output signal to transistor stage 29 that will drive a lamp 18 indicating a "leading" condition between the detected current and voltage. On the other hand, if the square wave signal from the voltage signal zero crossing detector 24 occurs first in time, then logical comparison stage 26 will provide an output signal to transistor stage 30 that will drive lamp 19, indicating a "lagging" condition.

Thus, the output from the second logical comparison stage 26 will correspond to the lead-lag relationship between the detected current and voltage, while the output from the first logical comparison stage will reflect the magnitude of the power factor corresponding to the phase angle $\theta$ between the detected current and voltage.

DC power for each of the active elements in the various stages 22–30 of circuit 20 is supplied from a power supply stage 31 connected to the output voltage from voltage selection device 34. It will of course be apparent that conventional batteries could also be used to provide the required DC power for the various stages 22–30.

Figure 2:
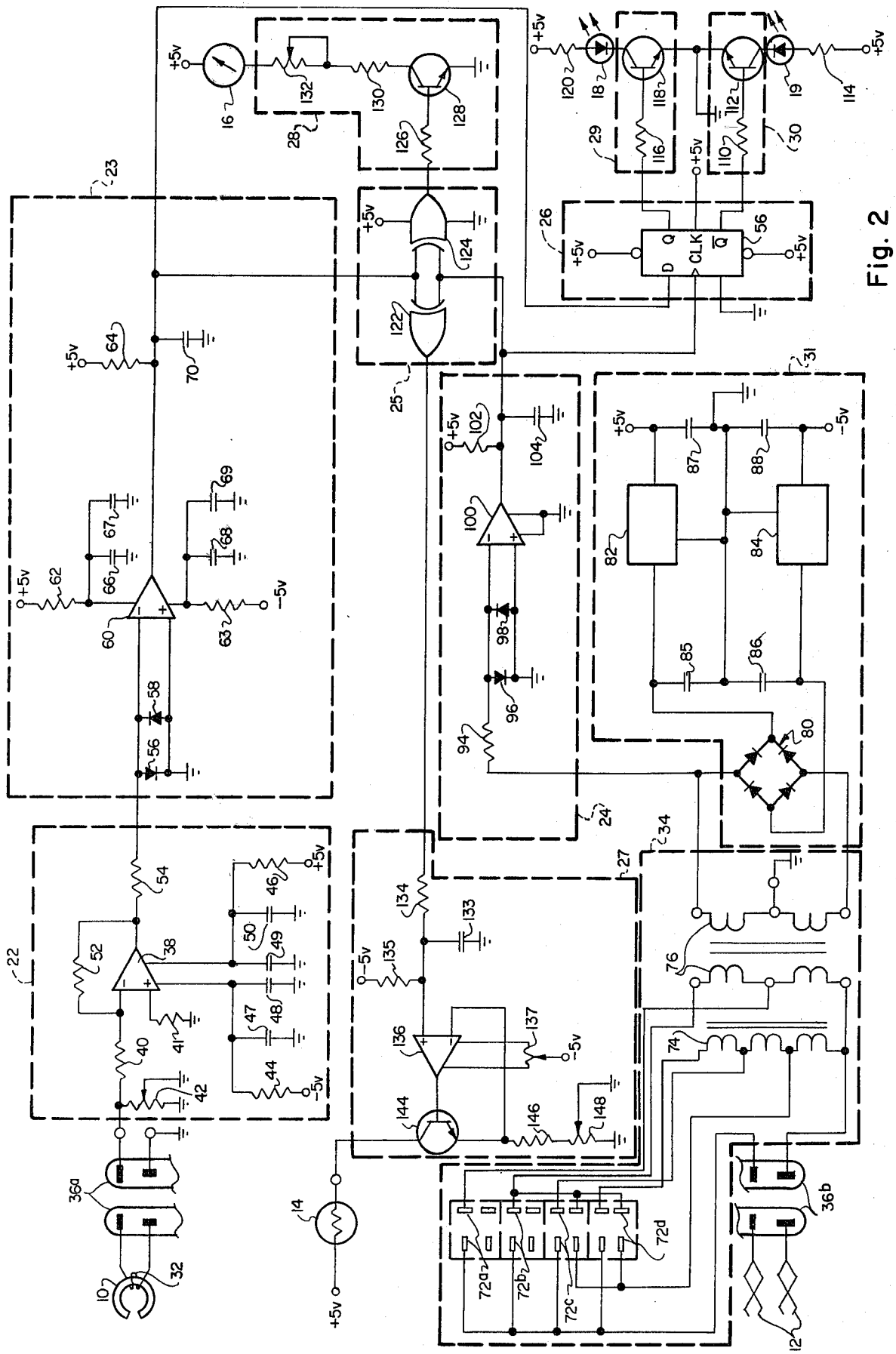
FIG. 2 is a schematic diagram of the electronic circuit of the power factor metering device of the present invention.

Reference is next made to FIG. 2, which illustrates in more detail one preferred embodiment for the schematic diagram derived from the block diagram of FIG. 1. Those of ordinary skill in the art will appreciate that various modifications to the detailed schematic diagram of FIG. 2 may be easily made without departing from the essential characteristics of the invention as described in connection with the block diagram of FIG. 1, above. Thus, the following description of the schematic diagram of FIG. 2 is intended only as an example of one presently preferred embodiment of a schematic diagram that is consistent with the foregoing description of FIG. 1 and the invention as claimed herein.

As shown in FIG. 2, the inductive coil 32 of current clamp 10 is coupled to the electronic circuit through a jack 36a. Jack 36a permits removal of current clamp 10 and its respective lead wires for ease in transportation and storage of the power factor metering device.

From jack 36a, inductive coil 32 is coupled through a low input variable resistor 42 to an operational amplifier 38. Variable resistor 42 is typically 100 ohms or less, and is ¼ watt, as are the other resistors shown and described in FIG. 2. Operational amplifier 38 may be provided on a conventional integrated circuit, as for example a Texas Instruments SN72747N chip.

As previously noted, the high inductance of coil 32 will cause the induced voltage across coil 32 to lag the detected current by approximately 90°. Due to the low input resistance of resistor 42, the voltage on the inverting input of operational amplifier 38 will lag the induced voltage across coil 32 by an additional 90°. Thus, the voltage on the inverting input of operational amplifier 38 will, for purposes of the power factor to be derived therefrom, appear to be in phase with the detected current as well as being proportional thereto.

The voltage induced across coil 32 is typically quite small (i.e. 5 mv per ampere of detected current). Thus, the induced voltage and the feedback signal are both applied to the inverting terminal of operational amplifier 38 in order to maintain a high input impedance at the input terminals of amplifier 38. The feedback signal is derived from the series connection of resistors 40 and 52. Resistor 41 is of a size (typically 120 ohms) that will maintain the voltage of the noninverting terminal of amplifier 38 at essentially zero. Thus, the gain of amplifier 38 will be proportional to the feedback signal provided by the ratio of resistor 52 to resistor 40. In the illustrated embodiment, resistor 52 may be 470K ohms, while resistor 40 may be 120 ohms, thus providing a gain of approximately 4000 through frequencies up to approximately 60 hz. The high voltage gain provided by amplifier 38 enables the small induced voltage at the amplifier's input to be amplified to a useful level, for purposes of accurate discrimination by succeeding circuit stages, as described below.

The integrated circuit for amplifier 38 is powered by the +5 volt and −5 volt DC inputs through resistors 46 and 44, which are typically 56 ohms. Capacitors 47–50 are used to filter noise and to eliminate any tendency to oscillate. Capacitors 47 and 50 are 10 microfarads and capacitors 48–49 are typically 0.1 microfarad. Resistor 54 is used to isolate the amplifier 38 from the following stage 23, and is 2.2K ohms in the illustrated embodiment.

From the high gain amplifier stage 22, the signal that corresponds to the detected current is input to the zero crossing detector stage 23. The signal is input through a pair of diodes 56 and 58 to an operational amplifier 60. Diodes 56 and 58 are oppositely connected and serve to clamp the amplified voltage signal from amplifier stage 22 to ±0.6 volts. In the illustrated embodiment, diodes 56 and 58 (as well as all other diodes in the schematic diagram of FIG. 2) may be Signetics IN4001 diodes, or any other comparable type of diode.

The operational amplifier 60 in FIG. 2 may be, for example, a National Semiconductor LN319D integrated circuit. Amplifier 60 is designed to function as a conventional voltage comparator. As the noninverting terminal of amplifier 60 goes positive with respect to the inverting terminal, the output voltage will be +5 volts DC. When the noninverting terminal goes negative with respect to the inverting terminal, the output voltage of amplifier 60 will drop to zero. Thus, in response to the signal input from amplifier 38, amplifier 60 provides at its output a 60 Hz square wave signal limited to the logical voltage levels of 0 and +5 volts DC.

The integrated circuit for amplifier 60 is powered by the +5 volt and −5 volt DC inputs through resistors 62–63, which are both 56 ohms in the illustrated embodiment. Capacitors 66–70, like capacitors 47–50 described above, filter noise and eliminate oscillation in the amplifier 60. Capacitors 66 and 68 are 10 microfarads, and capacitors 67 and 69–70 are 0.01 microfarad. Resistor 64 is a load resistor that provides a current path for purposes of biasing the output of amplifier 60. Resistor 64 is 820 ohms in the illustrated embodiment.

The square wave signal output from amplifier 60 is in phase with the detected current, and is used to provide one of the input signals to the two logical comparison stages 25 and 26, as described further below. The other input signal for the logical comparison stages 25–26 is derived from the voltage detected by voltage clips 12.

Voltage clips 12 are coupled to a voltage selection device 34 through a jack 36b. Jack 36b permits removal of voltage clips 12 and their respective lead wires for convenient storage and ease of transportation.

Figure 6:
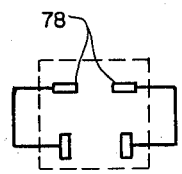
FIG. 6 is a schematic diagram of an adaptor that may be used with the voltage selection device shown in the schematic diagram of FIG. 2.

The voltage detected by voltage clips 12 is input through one of four plugs 72a–72d. The particular plug to be used is determined by placement of a plug adaptor 78 (see FIG. 6) in one of the plugs 72a–72d. The outputs from the various plugs 72a–72d lead to various connections on either transformer 74 or transformer 76. Transformer 74 is an autotransformer used to step down either a 480 volt wye input from plug 72c or a 480 volt delta input from plug 72d. Transformer 76 is used to step down either a 120 volt input from plug 72a or a 240 volt input from plug 72b. Thus, by virtue of the voltage selection device 34, the power factor metering device of the present invention has increased versatility because it can be used with most types of industrial or commercial power lines.

Since a slight shift in the phase of the signal output from voltage selection device 34 may occur, resistor 42 of high gain amplifier stage 22 is variable, as noted above. The impedance of resistor 42 may thus be adjusted so that the phase of the signal input to amplifier 38 will be shifted by a corresponding amount. Advantageously, this eliminates any error due to the slight phase shift that may be caused by the voltage selection device 34.

The output voltage signal from voltage selection device 34 is input through a full-wave bridge rectifier 80, formed by four diodes as shown in FIG. 2. The rectified outputs from full-wave bridge rectifier 80 are then filtered by capacitors 85–86, and input to integrated circuit voltage regulators 82 and 84. In the illustrated embodiment, capacitors 85–86 are 100 microfarads, and voltage regulators 82 and 85 are provided by conventional integrated circuits. For example, voltage regulator 82 may be a Motorola MC78L05C integrated circuit, and voltage regulator 84 may be a Fairchild UA79L05C integrated circuit. The outputs from voltage regulators 82 and 85 are isolated by capacitors 87–88, which are 0.1 microfarad in the illustrated embodiment. The +5 volt and −5 volt DC levels provided by voltage regulators 82 and 84 are used to power the active elements in the various circuit stages 22–30, as described herein.

The output voltage signal from voltage selection device 34 is also input to a zero crossing detector stage 24. Zero crossing detector stage 24 is analogous in its characteristics and function to the zero crossing detector stage 23 previously described. Resistor 94 (5.6 K ohms in the illustrated embodiment) drops the input voltage to a appropriate level. Diodes 96 and 98 then clamp the input voltage signal to ±0.6 volts. Amplifier 100, like amplifier 60, functions as a voltage comparator which changes its output state from 0 to +5 volts and vice versa each time the input signal crosses through zero. Amplifier 100 may be provided on the same integrated circuit chip as amplifier 60, and is thus powered by the same connection to the power supply 31 provided through resistors 62–63. Resistor 102 and capacitor 104 are identical in their value and function to resistor 64 and capacitor 70 described above.

The output signal from zero crossing detector stage 24 is in phase with the voltage detected at voltage clips 12. Thus, the square wave signal from zero crossing detector stage 24 is used as the other input signal to the two logical comparison stages 25 and 26.

Logical comparison stage 25 consists of an integrated circuit that provides two or more EXCLUSIVE-OR gates 122 and 124. In the embodiment of FIG. 2, EXCLUSIVE-OR gates 122 and 124 are provided by a Texas Instruments SN74LS86N integrated circuit, although other comparable integrated circuits could also be used. The output of both EXCLUSIVE-OR gates 122 and 124 consists of a doubled pulse whose width is directly proportional to the relative displacement (i.e. phase angle $\theta$) between the detected current and voltage.

Figure 3:
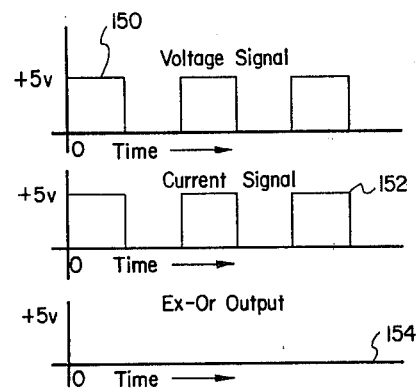
FIGS. 3, 4 and 5 are graphs that diagrammatically illustrate the way in which the power factor may be derived from the voltage and current signals detected by the power factor metering device of the present invention.

For example, as shown in FIG. 3 if the square wave signal 150 from zero crossing to detector stage 24 is in phase with the square wave signal 152 from zero crossing detector stage 23, then the output 154 of both EXCLUSIVE-OR gates 122 and 124 will be zero.

Figure 4:
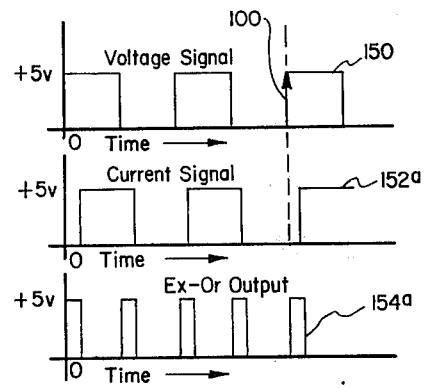

When the square wave signals 150 and 152a (see FIG. 4) from the zero crossing detector stages 23–24 are out of phase, then the output 154a of EXCLUSIVE-OR gates 122 and 124 will be high (i.e. +5 volts) so long as either of the inputs corresponding to the voltage and current signals is high. The output 154a of EXCLUSIVE-OR gates 122 and 124 will be low (i.e. zero volts) when the two input signals are either both high or both low.

Figure 5:
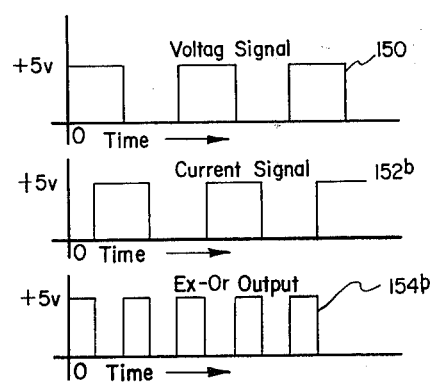

When square wave input signals 150 and 152b (see FIG. 5) are 90° out of phase, then the average output of the EXCLUSIVE-OR gates 122 and 124 will be proportionately higher. Thus, it will be seen that the output of each EXCLUSIVE-OR gate 122 and 124 is directly proportional to the magnitude of the phase difference between the input signals corresponding to the detected voltage and current.

Although the illustrated embodiment in FIG. 2 has been shown as using EXCLUSIVE-OR gates 122 and 124, other types of logical comparison gates could also be used. For example, OR gates (not shown) could be used rather than EXCLUSIVE-OR gates. Clearly, any type of logical comparison gate that produces an output signal directly proportional to the phase difference between the two input signals could be used.

With further reference to FIG. 2, the output from EXCLUSIVE-OR gate 122 is input to current amplifier stage 27. The input to current amplifier stage 27 is integrated by a low pass filter provided by resistor 134 and capacitor 133. Resistor 134 is 10 K ohms and capacitor 133 is 10 microfarads. The integrated signal is then input on the noninverting terminal of operational amplifier 136. Amplifier 136 may be provided on the same integrated circuit as that which provides amplifier 38, and is thus powered by the same connections to the power supply 31 as those provided for amplifier 38. Amplifier 136 is a unity gain amplifier whose output is designed to follow the integrated input by virtue of the feedback taken from the emitter of transistor 144 and input back to the inverting terminal of amplifier 136. Resistors 135 and 137 provides the appropriate biasing characteristics for amplifier 136, and in the illustrated embodiment are 470 K ohms and 10 K ohms respectively.

The output of amplifier 136 is used to drive a transistor 144. Resistors 146 and 148 are used to provide the appropriate biasing characteristics for transistor 144. Resistor 146 may be 1.5 K ohms and resistor 148 is a variable resistor that may provide up to 5 K ohms. As the output from amplifier 136 turns on the transistor 144, current is provided to the continuous recording device 14 in proportion to the magnitude of the phase angle as reflected by the output of EXCLUSIVE-OR gate 122. In other words, the digital pulses provided by EXCLUSIVE-OR gate 122 are transformed by the amplifier 136 and transistor 144 into a current signal that varies in proportion to the magnitude of the phase difference. In this manner, the current provided to the recording device 14 will reflect the magnitude of the power factor. The range of current values (0-1 mA) provided to the recording device 14 may be adjusted by adjusting variable resistor 148.

The magnitude of the power factor will also be reflected by the instantaneous meter 16, as previously noted. The output from EXCLUSIVE-OR gate 124 is input through resistor 126 to transistor 128. Resistor 126 (10 K ohms) provides the appropriate biasing characteristics for transistor 128. The output signal from EXCLUSIVE-OR gate 124 is used to turn the transistor 128 on thus permitting current to flow through the meter 16. Thus, the amount of current flowing through meter 16 will depend upon the values of resistors 130 and 132, which may be 33 K ohms and a variable 25 K ohms respectively.

It will of course be appreciated by those of ordinary skill in the art that the power factor metering device of the present invention could work equally well using only one of the power factor output devices 14 or 16. However, in practice it has been found to be useful to be able to record the magnitude of the power factor over a long period of time, as provided by recording device 14, as well as being able to directly read the magnitude of the power factor at any given point in time by virtue of the meter 16.

The square wave signals output from zero crossing detector stages 23 and 24 are also used as inputs to a second logical comparison stage 26, as previously noted. As shown in FIG. 2, the second logical comparison stage 26 consists of a bistable multivibrator 56 that is, in the illustrated embodiment, a D-type flip flop. The D flip flop 56 is used to discriminate which of the two signals occurs first in time. If, for example, the signal from zero crossing detector stage 23 occurs first in time (i.e. indicating the detected current leads the voltage), then the flip flop 56 will provide an output signal through resistor 116 to transistor 118. The output signal through resistor 116 (10 K ohms in the illustrated embodiment) will turn transistor 118 on, causing current to flow through the light-emitting diode 18. Resistors 120 and 116 provide the appropriate current levels for purposes of driving the light-emitting diode 18.

On the other hand, if the square wave signal from zero crossing detector stage 24 occurs first in time (indicating that the detected voltage leads the detected current), then the D flip flop 56 will provide an output signal through resistor 110 to transistor 112. Resistor 110, transistor 112, light-emitting diode 19 and resistor 114 function in exactly the same manner as resistor 116, transistor 118, light admitting diode 18 and resistor 120 described above. Thus, D flip flop 56 provides a signal that is used to discriminate between the leading and lagging conditions. In this way one may determine whether the electrical system is capacitive or inductive and may thus take the appropriate steps to correct the power factor by adding either capacitance or inductance as the case may be.

From the foregoing description, the way in which the power factor metering device of the present invention may be used to determine the power factor of either a single or three phase circuit operating at any one of the specified voltage levels will be apparent. The current clamp 10 is placed over one of the conductors and the voltage clips 12 are then used to detect the single phase voltage of the power line. Once the current clamp 10 and voltage clips 12 are in place, the magnitude of the power factor will be reflected on the instantaneous meter 16 and may be continuously recorded over a period of time on the recording device 14. The light-emitting diodes 18 and 19 will provide visual indication of whether the power factor is due to a leading or a lagging condition, as described above.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed and desired to be secured by U.S. Letters Patent is:

1. A power factor metering device comprising:
first sensing means for detecting an electrical current;
second sensing means for detecting an electrical voltage;
first indicator means for displaying the magnitude of the power factor derived from the current and voltage detected by said first and second sensing means;
second indicator means for displaying the lead-lag relationship between the detected current and voltage; and
an electronic circuit interconnected between said first and second sensing means and said first and second indicator means, the electronic circuit comprising:
means for scaling said detected voltage so as to accommodate a variety of input voltage levels;
first signal input means for developing a first input signal from said detected current;
second signal input means for developing a second input signal from said detected voltage;
first logic means for deriving a first output signal from said first and second input signals, said first output signal being proportional to the phase angle between said detected voltage and current;
second logic means for deriving a second output signal from said first and second input signals, said second output signal corresponding to the lead-lag relationship between said detected current and voltage;
means for using said first output signal to drive said first indicator means so as to display said power factor;
means for using said second output signal to drive said second indicator means so as to display said lead-lag relationship; and
power supply means for providing power to the various elements of said electronic circuit and said first and second indicator means.

2. A power factor metering device as defined in claim 1 wherein said first sensing means comprises a current clamp.

3. A power factor metering device as defined in claim 1 wherein said second sensing means comprise a pair of voltage clips.

4. A power factor metering device as defined in claim 2 wherein said first signal input means comprise:
a high gain amplifier stage coupled to said current clamp through a low input resistor, the low input resistor being variable so as to compensate for errors induced in the phase relationship between said detected current and voltage; and a zero crossing detector stage coupled to the output of said high gain amplifier stage through a pair of diodes, said zero crossing detector stage developing at its output a first square wave input signal that corresponds to the detected current.

5. A power factor metering device as defined in claim 3 wherein said second signal input means comprise:
a voltage transformer coupled to said voltage clips; and
a zero crossing detector stage coupled through a pair of diodes to the output of said transformer, the zero crossing detector stage developing at its output a square wave signal that corresponds to the detected voltage.

6. A power factor metering device as defined in claim 1 wherein said first logic means comprise an EXCLUSIVE-OR logic gate.

7. A power factor metering device as defined in claim 6 wherein said means for using said first output signal comprise a current amplifier stage and wherein said first indicator means comprise a continuous recording device driven by said current amplifier stage.

8. A power factor metering device as defined in claim 6 wherein said means for using said first output signal comprise a driving transistor and wherein said first indicator means comprise an instantaneous readout meter coupled to said transistor.

9. A power factor metering device as defined in claim 1 wherein said first logic means comprise at least two EXCLUSIVE-OR logic gates.

10. A power factor metering device as defined in claim 9 wherein:
said means for using said first output signal comprise (1) an operational amplifier and a first transistor connected to the output of one of said EXCLUSIVE-OR gates, and (2) a second transistor connected to the output of the other EXCLUSIVE-OR gate; and
wherein said first indicator means comprise (1) a continuous recording device coupled to the output of said first transistor and (2) an instantaneous readout meter coupled to the output of said second transistor.

11. A power factor metering device as defined in claim 1 wherein said second logic means comprise a bistable multivibrator for determining which of said first and second input signals occurs first in time with respect to the other input signal.

12. A power factor metering device as defined in claim 11 wherein said means for using said second output signal comprise a pair of driving transistors, each said transistor being coupled to a separate output of said bistable multivibrator, and wherein said second indicator means comprise a pair of lamp indicators, each lamp indicator being coupled to one of said driving transistors.

13. A power factor metering device comprising:
a current clamp for detecting an electrical current and for inducing a first voltage proportional to the detected current;
a pair of voltage clips for detecting a second voltage;
a high gain amplifier stage coupled to said first voltage through a low input resistance;
a transformer coupled to said second voltage;
a first zero crossing detector stage coupled to the output of said high gain amplifier stage, said first zero crossing detector stage developing at its output a first input signal corresponding to said first voltage;
a second zero crossing detector stage coupled to the output of said transformer, said second zero crossing detector stage developing at its output a second input signal corresponding to said second voltage;
a first logic stage coupled to said first and second input signals, said first logic stage developing at its output a first output signal that is proportional to the phase angle between said detected current and said detected second voltage;
a second logic stage coupled to said first and second input signals, said second logic stage developing at its output a second output signal that reflects the lead-lag relationship between said detected current and said detected second voltage;
a first driving stage coupled to the output of said first logic stage, said first driving stage using said first output signal to drive a power factor readout device;
a second driving stage coupled to the output of said second logic stage, said second driving stage using said second output signal to drive a lead-lag readout device;
a power factor readout device coupled to said first driving stage;
a lead-lag readout device coupled to said second driving stage; and
a power supply for providing power to each said stage and each said readout device.

14. A power factor metering device as defined in claim 13 wherein said high gain amplifier stage comprises an operational amplifier configurated so as to provide a gain of approximately 4,000 through frequencies up to approximately 60 Hz, and wherein said low input resistance in the phase relationship between the detected current and voltage.

15. A power factor metering device as defined in claim 13 wherein said transformer comprises a series of coils that may be coupled so as to accommodate 120 volt, 240 volt, or 480 volt inputs, and wherein said transformer is provided with a plurality of selectable plug configurations for changing the interconnection of said coils so as to accommodate said differing voltage inputs.

16. A power factor metering device as defined in claim 13 wherein said first and second zero crossing detector stages each comprise an operational amplifier coupled through a pair of diodes to one of said first and second voltages provided at the outputs of said transformer and said high-gain amplifier stage.

17. A power factor metering device as defined in claim 13 wherein said first logic stage comprises an EXCLUSIVE-OR logic gate.

18. A power factor metering device as defined in claim 13 wherein said second logic stage comprises a bistable multivibrator.

19. A power factor metering device as defined in claim 13 wherein said power factor readout device comprises a continuous recording device and wherein said first driving stage comprises:
an operational amplifier coupled through a lowpass filter to the output of said first logic stage; and
a transistor for driving said continuous recording device, said transistor being coupled to the output of said operational amplifier.

20. A power factor metering device as defined in claim 13 wherein said power factor readout device comprises an instantaneous meter and wherein said first driving stage comprises a transistor coupled to the output of said first logic stage, said transistor driving said instantaneous meter.

21. A power factor metering device as defined in claim 13 wherein said lead-lag readout device comprises a pair of light-emitting diodes and wherein said second driving stage comprises a pair of transistors, each transistor being coupled to the output of said second logic stage and driving one of said light-emitting diodes.

22. A power factor metering device as defined in claim 13 wherein:
said first logic stage comprises a pair of EXCLUSIVE-OR logic gates, each said gate being coupled at its input to said first and second input signals;
said power factor readout device comprises a continuous recording device and an instantaneous meter; and
said first driving stage comprises an operational amplifier coupled through a lowpass filter to the output of one of said EXCLUSIVE-OR gates, a first transistor coupled to the output of said operational amplifier, said first transistor driving said continuous recording device, and a second transistor coupled to the output of the other EXCLUSIVE-OR gate, said second transistor driving said instantaneous meter.

23. A power factor metering device as defined in claim 13 wherein said power supply comprises four diodes configurated as a full-wave bridge rectifier coupled to a pair of integrated circuit voltage regulators.

24. A power factor metering device comprising:
a current clamp for detecting an electrical current and for inducing a first voltage proportional to the detected current;
a pair of voltage clips for detecting a second voltage;
a first high gain operational amplifier coupled to said first voltage through a low input variable resistance;
a transformer coupled to said second voltage, said transformer comprising a series of coils and a plug selection device for connecting said coils so as to accommodate various levels of input voltage;
a second operational amplifier coupled through a first pair of diodes to the output of said first operational amplifier, said second operational amplifier developing at its output a first square wave signal;
a third operational amplifier coupled through a second pair of diodes to the output of said transformer, said third operational amplifier developing a second square wave signal at its output;
a pair of EXCLUSIVE-OR logic gates, each said EXCLUSIVE-OR gate being coupled at its input to each of said first and second square wave signals, said EXCLUSIVE-OR gates each developing at its output a signal that is proportional to the phase angle between said detected current and said detected second voltage;
a fourth operational amplifier coupled through a lowpass filter to the output of one of said EXCLUSIVE-OR gates;
a first transistor coupled to the output of said fourth operational amplifier;
a continuous recording device for recording the power factor in response to the output signal from one of said EXCLUSIVE-OR gates, said continuous recording device being driven by said first transistor;
a second transistor coupled to the output of the other of said EXCLUSIVE-OR gates;
an instantaneous meter for indicating the power factor at any given instant, said instantaneous meter being driven by said second transistor;
a bistable multivibrator coupled coupled at its input to said first and second square wave signals provided at the outputs of said second and third operational amplifiers;
a third transistor coupled to one of the outputs of said bistable multivibrator;
a fourth transistor coupled to the other output of said bistable multivibrator;
a first light-emitting diode connected to said third transistor;
a second light-emitting diode connected to said fourth transistor, said first and second light-emitting diodes indicating the lead-lag relationship derived by said bistable multivibrator from said first and second squarewave signals; and
a full-wave bridge rectifier in combination with a pair of integrated circuit voltage regulators coupled to the output of said transformer, said rectifier and voltage regulators providing DC power to each of said operational amplifiers, EXCLUSIVE-OR logic gates, said bistable multivibrator, said transistors, said light-emitting diodes, said continuous recording device and said instantaneous meter.

* * * * *